United States Patent
Akiyama et al.

(10) Patent No.: US 9,502,385 B2
(45) Date of Patent: *Nov. 22, 2016

(54) SEMICONDUCTOR DEVICE AND CONNECTION CHECKING METHOD FOR SEMICONDUCTOR DEVICE

(71) Applicant: Renesas Electronics Corporation, Kawasaki-shi (JP)

(72) Inventors: Naoto Akiyama, Kawasaki (JP); Toshiaki Umeshima, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/689,736

(22) Filed: Apr. 17, 2015

(65) Prior Publication Data
US 2015/0221618 A1    Aug. 6, 2015

Related U.S. Application Data

(63) Continuation of application No. 13/716,341, filed on Dec. 17, 2012, now Pat. No. 9,041,185, which is a
(Continued)

(30) Foreign Application Priority Data

Nov. 27, 2008    (JP) ................ 2008-301888

(51) Int. Cl.
*H01L 21/48*    (2006.01)
*H01L 25/065*    (2006.01)
(Continued)

(52) U.S. Cl.
CPC ........... *H01L 25/0657* (2013.01); *H01L 22/32* (2013.01); *H01L 23/3142* (2013.01);
(Continued)

(58) Field of Classification Search
CPC ................ H01L 25/0657; H01L 23/49816
(Continued)

(56) References Cited

U.S. PATENT DOCUMENTS

2006/0194353 A1    8/2006    Spuhler et al.
2007/0235850 A1    10/2007    Gerber et al.
(Continued)

FOREIGN PATENT DOCUMENTS

JP    2008-232769 A    10/2008
JP    2009-053033 A    3/2009

OTHER PUBLICATIONS

Notice of Allowance dated Jan. 21, 2015 in co-pending U.S. Appl. No. 13/716,341.
(Continued)

*Primary Examiner* — Jamie C Niesz
(74) *Attorney, Agent, or Firm* — McGinn IP Law Group, PLLC

(57) ABSTRACT

A package-on-package (POP), including a semiconductor device, and a multi-chip-package located above the semiconductor device, wherein the semiconductor device includes a substrate including a first surface, a plurality of electrodes formed on the first surface, a second surface opposite to the first surface, a plurality of lands formed on the second surface, and a plurality of wirings, (a2) a semiconductor chip mounted over the first surface of the substrate, and (a3) a plurality of first solder balls formed on the lands, respectively, wherein the multi-chip-package is electrically connected with the semiconductor device via a plurality of second solder balls, wherein the plurality of second solder balls are connected with the plurality of electrodes, respectively.

20 Claims, 5 Drawing Sheets

Related U.S. Application Data continuation of application No. 12/591,424, filed on Nov. 19, 2009, now Pat. No. 8,421,206.

(51) Int. Cl.
*H01L 21/66* (2006.01)
*H01L 23/498* (2006.01)
*H01L 23/31* (2006.01)
*H01L 23/00* (2006.01)

(52) U.S. Cl.
CPC ......... *H01L 23/49816* (2013.01); *H01L 24/05* (2013.01); *H01L 24/17* (2013.01); *H01L 24/49* (2013.01); *H01L 2224/0401* (2013.01); *H01L 2224/05573* (2013.01); *H01L 2224/05599* (2013.01); *H01L 2224/131* (2013.01); *H01L 2224/16225* (2013.01); *H01L 2224/16227* (2013.01); *H01L 2224/1705* (2013.01); *H01L 2224/32225* (2013.01); *H01L 2224/49174* (2013.01); *H01L 2224/73204* (2013.01); *H01L 2224/85399* (2013.01); *H01L 2225/06513* (2013.01); *H01L 2924/00013* (2013.01); *H01L 2924/00014* (2013.01); *H01L 2924/15174* (2013.01); *H01L 2924/15192* (2013.01); *H01L 2924/15311* (2013.01); *H01L 2924/181* (2013.01)

(58) Field of Classification Search
USPC ................ 257/692, 693; 324/750.03, 762.02
See application file for complete search history.

(56) References Cited

U.S. PATENT DOCUMENTS

| | | | |
|---|---|---|---|
| 2008/0185719 A1 | 8/2008 | Cablao et al. | |
| 2009/0121346 A1* | 5/2009 | Wachtler | H01L 23/5387 257/724 |
| 2009/0322364 A1* | 12/2009 | Mangrum | G01R 31/2889 324/757.02 |
| 2010/0009471 A1* | 1/2010 | Mizoguchi | G01R 1/07378 438/15 |

OTHER PUBLICATIONS

Final Office Action dated Sep. 26, 2014 in co-pending U.S. Appl. No. 13/716,341.
Non-Final Office Action dated Feb. 19, 2014 in co-pending U.S. Appl. No. 13/716,341.
Final Office Action dated Sep. 5, 2013 in co-pending U.S. Appl. No. 13/716,341.
Non-Final Office Action dated Apr. 5, 2013 in co-pending U.S. Appl. No. 13/716,341.
First Office Action dated May 16, 2012 in U.S. Appl. No. 12/591,424.
Final Office Action dated Oct. 3, 2012 in U.S. Appl. No. 12/591,424.

* cited by examiner

SEMICONDUCTOR DEVICE AND CONNECTION CHECKING METHOD FOR SEMICONDUCTOR DEVICE

The present application is a Continuation Application of U.S. patent application Ser. No. 13/716,341, filed on Dec. 17, 2012, which is a Continuation application of U.S. patent application Ser. No. 12/591,424, filed on Nov. 19, 2009, now U.S. Pat. No. 8,421,206 which is based and claims priority from Japanese Patent Application No. 301888/2008, filed on Nov. 27, 2008, the entire contents of which is incorporated herein by reference.

BACKGROUND OF THE INVENTION

1. Field of the Invention

The present invention relates to a semiconductor device and a connection checking method for a semiconductor device. The present invention relates particularly to a semiconductor device and a connection checking method for a semiconductor device which makes it possible to check on a connection between a land and a connection terminal connected to the land.

2. Description of Related Art

In a package on package (POP) structure, as shown in FIG. 4, a first land 210 is formed in the top surface of a package substrate placed in the lower tier of the structure. Solder balls 40 formed on the undersurface of a multi-chip package (MCP) 4, such as a memory, placed in the upper tier of the structure are connected to the first land 210 (see FIG. 1). The first land 210 is connected to a second land 211 formed in the undersurface of the package substrate 2 through a connection interconnection 212. Solder balls 213 are connected to the second land 211. It is important to properly connect the second land 211 and the solder balls 213 so that a favorable electric connection between the solder balls 213 and the MCP 4 can be secured.

Meanwhile, semiconductor device manufacturers/shippers, for instance, purchase package substrates, manufacture semiconductor devices by forming semiconductor chips and solder balls on the package substrates, and subsequently ship the semiconductor devices. The semiconductor device manufacturers/shippers are required to guarantee a proper connection between the solders ball in question and the second land.

To this end, the semiconductor device manufacturer/shippers check on the connection between the second land 211 and the solder balls 213. Note that solder balls 203 connected to the semiconductor chip 3 through connection interconnections 202 are also formed in the undersurface of the package substrate 2 so as to be connected to a semiconductor chip 3. The electrical connection between these solder balls 203 and the semiconductor chip 3 can be checked on by use of the semiconductor chip 3.

Whether or not the solder balls 213 not connected to the semiconductor chip 3 are connected to the second land 211 properly is checked as shown in FIG. 4, for instance. To put it specifically, a connection checking apparatus 100 includes an upper socket 110 and a lower socket 120. The upper socket 110 includes measurement pins 111. The lower socket 120 also includes measurement pins 121. By use of the connection checking apparatus 110 of this type, a semiconductor device a is inserted between the upper socket 110 and the lower socket 120. Subsequently, the measurement pins 111 of the upper socket 110 are positioned to the first land 210 of the semiconductor device a, whereas the measurement pins 121 of the lower socket 120 are positioned to the solder balls 213 of the semiconductor device a. Thereafter, the semiconductor device a is sandwiched between the upper socket 110 and the lower socket 120. Thus, the measurement pins 111 of the upper socket 110 and the measurement pins 121 of the lower socket 120 are respectively brought into contact with the first land 210 of the semiconductor device a and the solder balls 213 at a time. Afterward, a voltage or an electric current is applied to the measurement pins 111 or the measurement pins 121, and a value of the resistance between the first land 210 and each solder ball 213 is thus measured. When the resistance value is smaller than a predetermined threshold value, it can be confirmed that the first land 210 is connected to the solder balls 213 properly. On the contrary, when the resistance value is equal to or larger than the predetermined threshold value, it can be confirmed that the first land 210 is connected to the solder balls 213 defectively. As described above, when the proper connection between the first land 210 and the solder ball 213 can be confirmed, the proper connection between the second land 211 and the solder balls 213 can be guaranteed.

For reference, Japanese Patent Application No. 2008-232769 discloses a method of judging a proper connection in a semiconductor device having the POP structure.

The semiconductor device a having the configuration shown in FIG. 4 has the following problems in checking on the connection between the second land 211 and the solder ball 213.

To put it specifically, the measurement pins 111 of the upper socket 110 need to be positioned to the first land 210 of the semiconductor device a, and the measurement pins 121 of the lower socket 120 need to be positioned to the solder balls 213 of the semiconductor device a. During their positioning, if the upper socket 110 is positioned to the semiconductor device a with poor accuracy as shown in FIG. 5, an area around the first land 210 in the package substrate 2 is likely to be damaged.

Furthermore, in a case where the measurement is carried out multiple times for some reason such as a poor electrical connection between the first land 210 and the measurement pins 111, the front extremity portion of the measurement pins 111 contacts the first land 210 multiple times. This might cause damage to the first land 210.

SUMMARY

In one aspect of the present invention, a semiconductor device includes a substrate, a first land formed in a first surface of the substrate, a second land formed in a second surface of the substrate, a first terminal coupled to the second land, a line coupled to the first land and the second land, a second terminal formed in the second surface of the substrate, and, a branch line coupled to the line and the second terminal. The second terminal is coupled to the first land and the second land and is not coupled to other lands in the first surface and the second surface is a different surface from the first surface.

The present invention makes it possible to check on the connection between the connection terminals and the land, with the semiconductor device being kept in a sound condition, the connection not being allowed to be checked by use of the semiconductor chip.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

Figure 1:
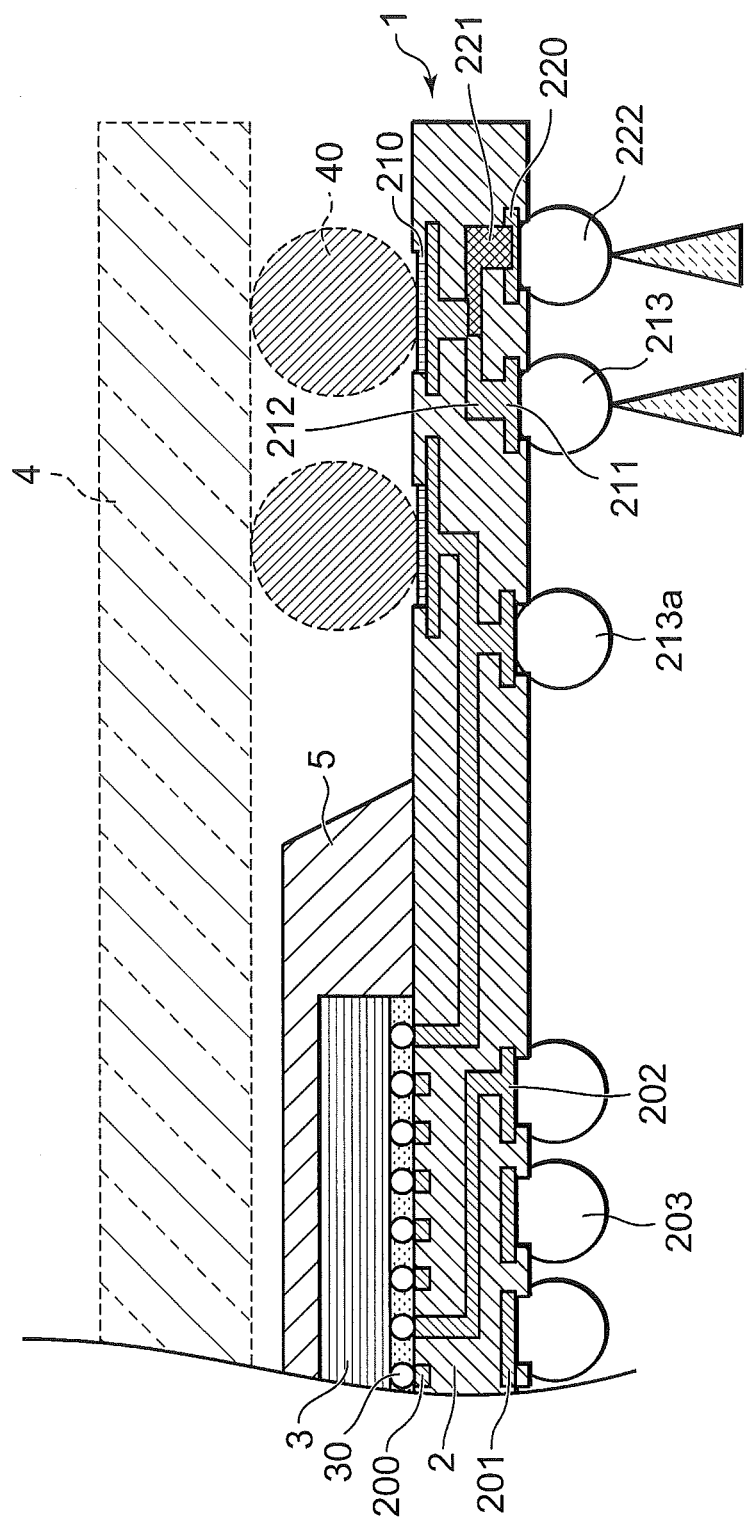
FIG. 1 is a cross-sectional diagram schematically showing a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Referring to the drawings, detailed descriptions will be provided for concrete embodiments to which the present invention is applied. Note that the present invention is not limited to the following embodiments. For the purpose of clarifying the explanations, the following descriptions and the drawings are simplified whenever deemed necessary.

As shown in FIG. 1, a semiconductor device 1 according to the present embodiment includes a package substrate 2 and a semiconductor chip 3. An MCP 4 is mounted on an upper tier of this semiconductor device 1.

The semiconductor device 1 is of a ball grid array (BGA) type. Chip connection lands 200 are formed in an area on a first principal surface (top surface) of the package substrate 2, on which the semiconductor chip 3 is mounted. Solder balls 30 formed on the undersurface of the semiconductor chip 3 are connected to the chip connection lands 200, respectively. Lands 201 corresponding to the chip connection lands 200 are formed in a second principal surface (undersurface) of the package substrate 2. The chip connection lands 200 are connected to the lands 201 through a connection interconnection 202. As connection terminals, the solder balls 203 are connected to the lands 201, respectively.

Figure 2:
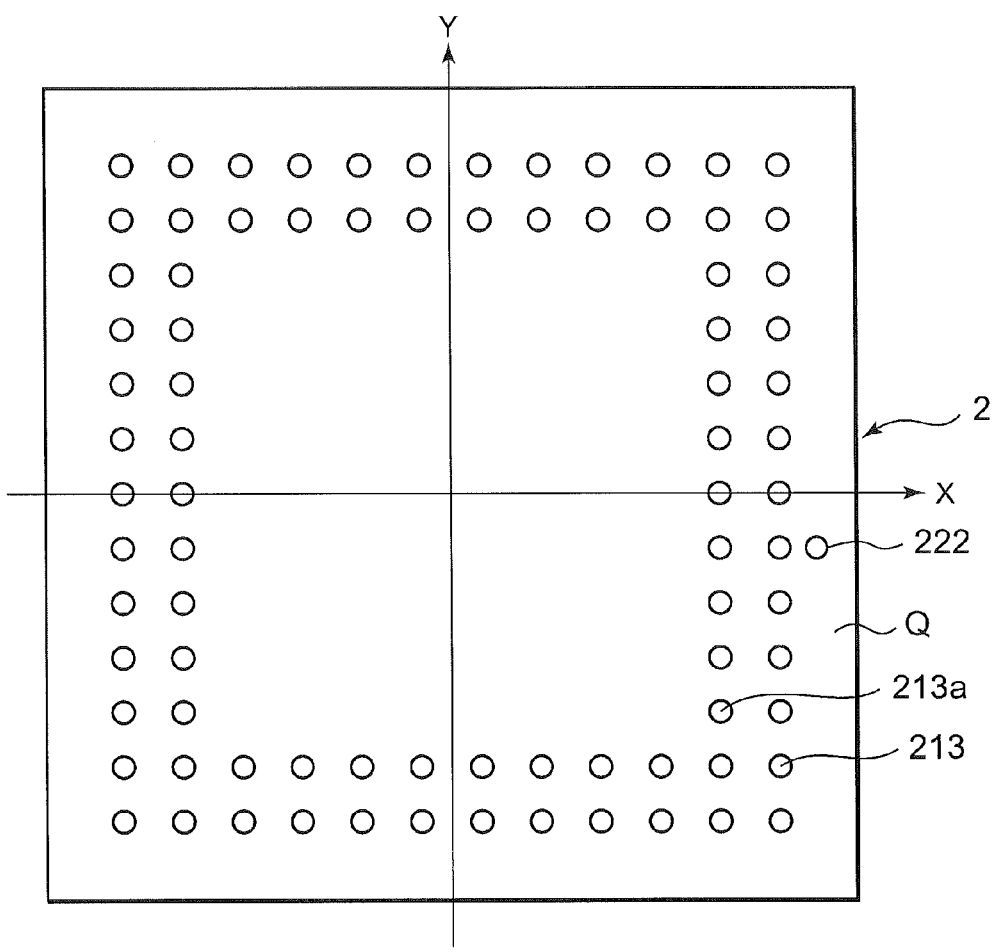
FIG. 2 is a diagram schematically showing an arrangement relationship between first solder balls and a second solder ball.

A first land 210 is formed along a circumference of the top surface of the package substrate 2. Solder balls 40 formed on the undersurface of the MCP 4 are connected to the first land 210. A second land 211 corresponding to the first land 210 is also formed along a circumference of the undersurface of the package substrate 2. The first land 210 and the second land 211 are connected together through a connection interconnection 212. As first connection terminals, solder balls (first solder balls) 213 are connected to the second land 211. For reference, FIG. 2 is a schematic diagram showing how the first solder balls 213 and a second solder ball 222 are arranged on the undersurface of the package substrate 2. The solder balls 203 are omitted from FIG. 2.

The first solder balls 213 have a configuration which makes it impossible to check on the connection between the second land 211 and the first solder balls 213 by use of the semiconductor chip 3. To put it specifically, the first solder balls 213 are not connected to the semiconductor chip 3. In other words, no electrical paths are formed between the semiconductor chip 3 and the first solder balls 213. However, because the first solder balls 213a arranged inside the first solder balls 213 are connected to the semiconductor chip 3 as shown in FIG. 1, the connection of the solder balls 213a can be checked by use of the semiconductor chip 3.

A third land 220 is formed on the undersurface of the package substrate 2. The third land 220 is connected to the connection interconnection 212 through a branch interconnection 221. As a second connection terminal, a solder ball (second solder ball) 222 is connected to the third land 220. To put it specifically, the second solder ball 222 is connected to the connection interconnection 212 through the branch interconnection 221.

The semiconductor chip 3 is a logic circuit such as an LSI (Large Scale Integration) circuit. However, the semiconductor chip 3 is not limited to the logic circuit. The semiconductor chip 3 is connected to the top surface of the package substrate 2 by flip chip bonding. The solder balls 30 on the undersurface of the semiconductor chip 3 are connected to the chip connection lands 200 in the package substrate 2. The semiconductor chip 3 is sealed in a resin sealing member 5.

By use of the semiconductor device 1 thus configured, it is checked whether or not a value of a resistance between each first solder ball 213 and the second solder ball 222 is smaller than a predetermined threshold value. To put it specifically, a voltage or an electric current is applied to one of each first solder ball 213 and the second solder ball 222, and a value of the resistance between the first solder ball 213 and the second solder ball 222 is measured. When the resistance value is smaller than the predetermined threshold value, it can be confirmed that the first solder ball 213 and the second solder ball 222 are connected together properly. On the contrary, when the resistance value is equal to or larger than the predetermined threshold value, it can be confirmed that the first solder ball 213 and the second solder ball 222 are connected together defectively. As described above, when the proper connection between the first solder ball 213 and the second solder ball 222 can be confirmed, the proper connection between the second land 211 and each solder ball 213 can be guaranteed.

A resistance value which makes it possible to guarantee a condition in which each first solder ball 213 and the second solder ball 222 are connected together properly is set up as the predetermined threshold value.

At this time, like the conventional type of connection checking apparatus, a connection checking apparatus 100 according to the present invention checks on the connection between the second land 211 and each first solder ball 213 with the semiconductor device 1 being sandwiched between an upper socket 110 and a lower socket 120. In the semiconductor device 1, the first solder balls 213 and the second solder ball 222 are formed in the same surface of the package substrate 2. For this reason, a contact of measurement pins 121 of the lower socket 120 to the first solder balls 213 and the second solder ball 222 formed in the undersurface of the package substrate 2 suffices to check whether or not the first solder balls 213 are connected to the second solder ball 222. Unlike the conventional type of connection checking apparatus, the connection checking apparatus 100 can eliminate a step of positioning the measurement pins 111 of the upper socket 110 to the first land 210 formed in the top surface of the package substrate 2. Consequently, the first land 210 formed in the top surface of the package substrate 2 is no longer damaged, and an area around the first land 210 is no longer damaged. Accordingly, the connection between the second land 211 and the first solder balls 213 can be checked on with the semiconductor device 1 being kept in a sound condition. In addition, the positioning of only the lower socket 120 to the package substrate 2 suffices to check on whether or not the first solder balls 213 are connected to the second solder ball 222. For this reason, it is possible to easily check on the connection between the second land 211 and the first solder balls 213. This enhances the yields and productivity of semiconductor devices. Moreover, because the measurement pins 111 of the upper socket 110 of the connection checking apparatus 100 can be eliminated, the connection between the second land 211 and the first solder balls 213 can be checked on by use of an economical connection checking apparatus.

Figure 3:
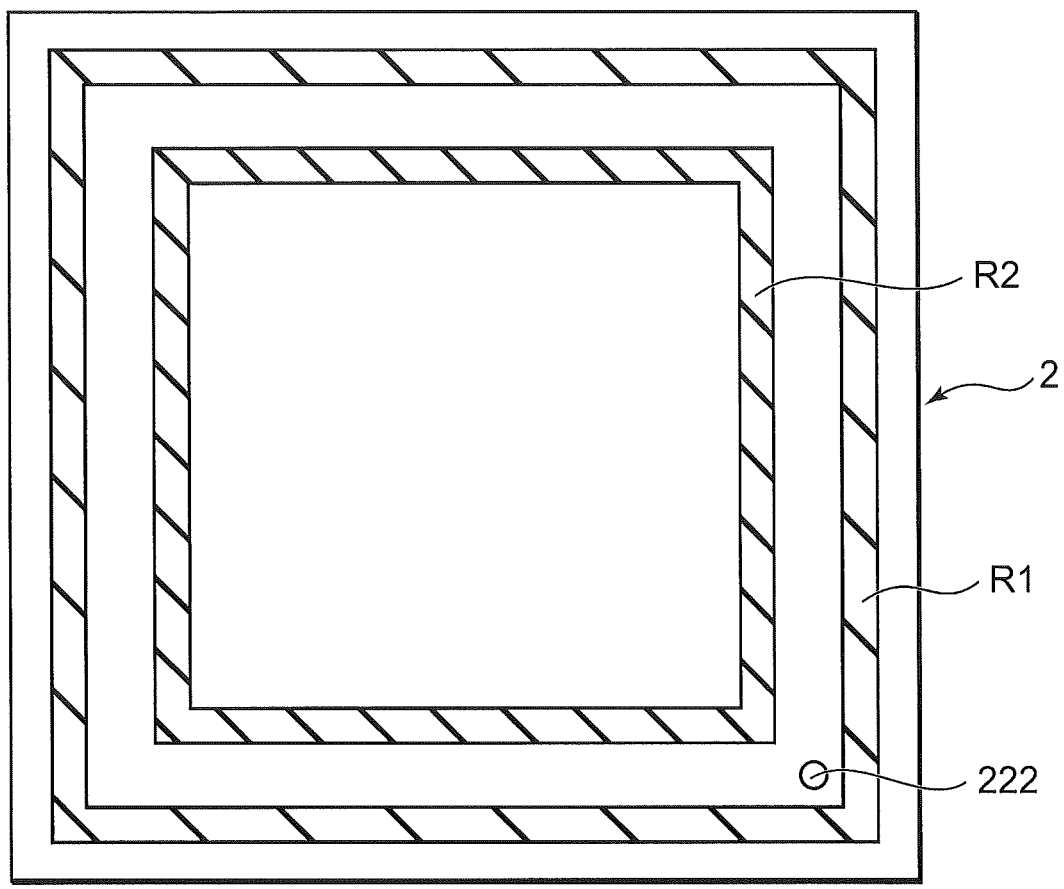
FIG. 3 is a diagram schematically showing a different arrangement relationship between first solder balls and a second solder ball.
Figure 4:
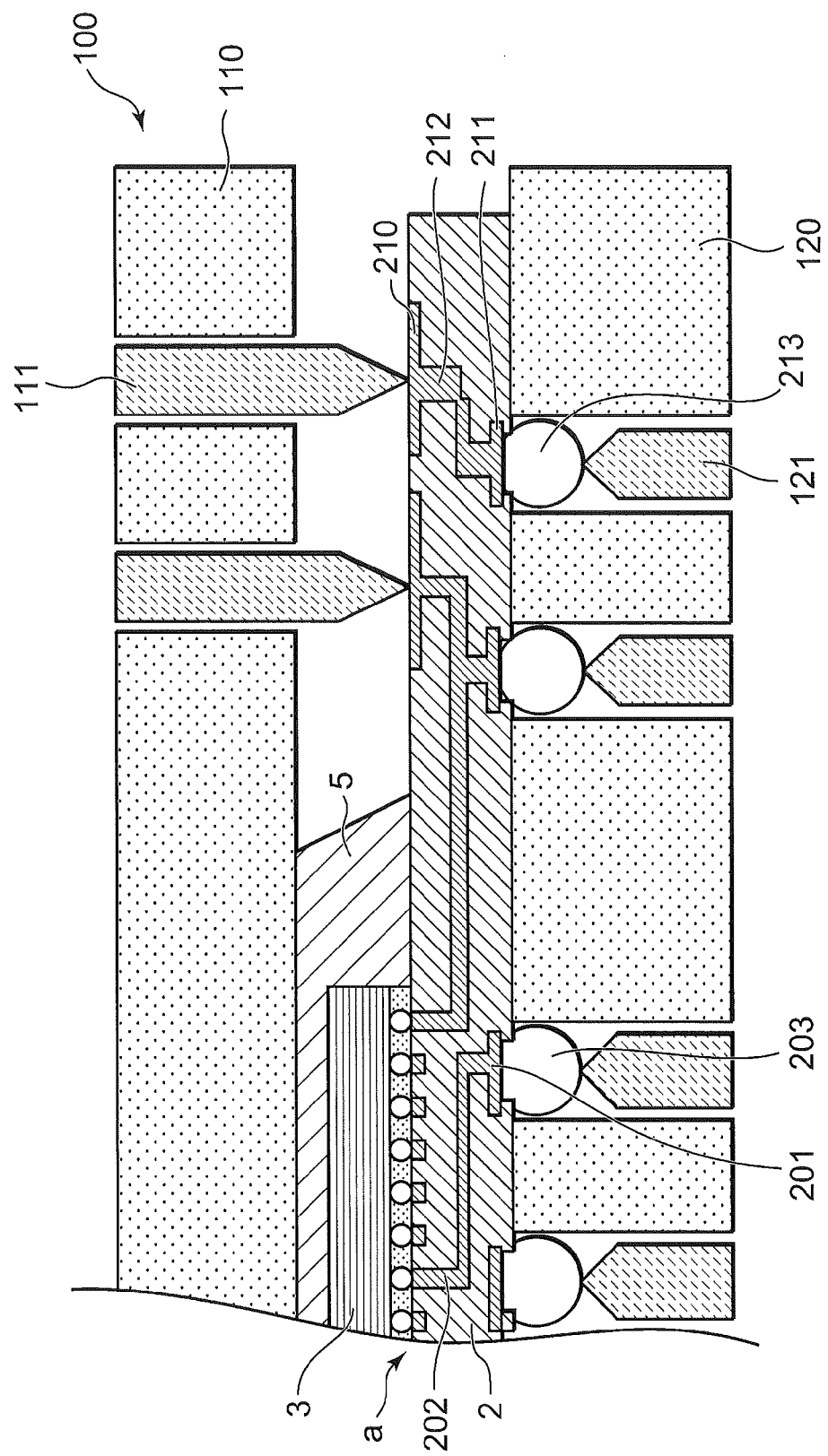
FIG. 4 is a diagram schematically showing a relevant connection checking method for a semiconductor device.
Figure 5:
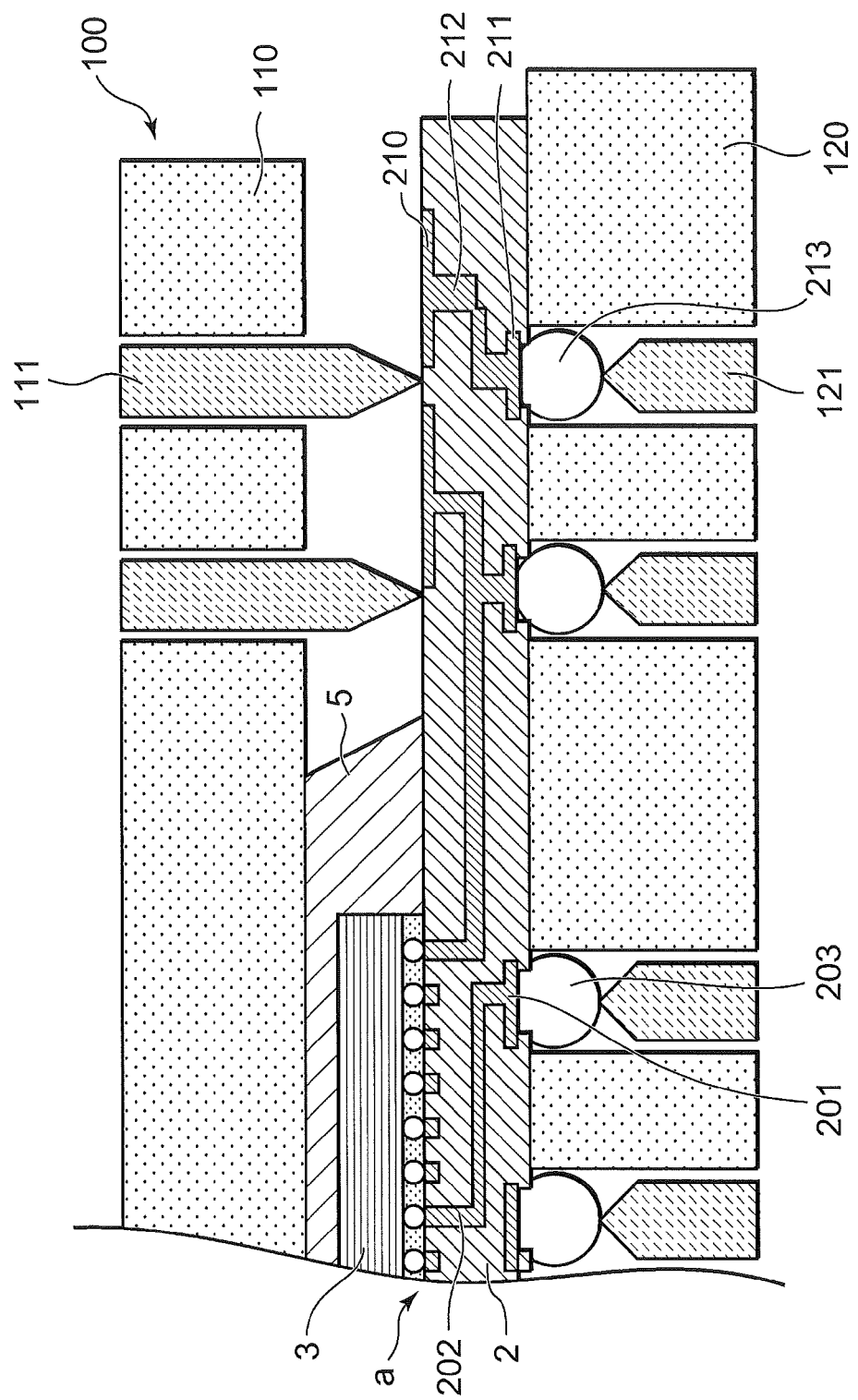
FIG. 5 is a diagram schematically showing how measurement pins of a connection checking apparatus come off a land.

FIG. 2 shows an example of an arrangement in which the second solder ball 222 is arranged outside the first solder balls 213. However, an arrangement relationship between the second solder ball 222 and the first solder balls 213 is not limited to the arrangement shown in FIG. 2. To put it specifically, as shown in FIG. 3, the second solder ball 222 may be arranged, for instance, in a vacant area between an area R1 and an area R2 where the first solder balls 213 (a). In sum, the second solder ball 222 may be formed in a vacant area in the same surface of the package substrate 2 as the first solder balls 213 are formed. This configuration makes it possible to check on the connection between the second land 211 and the first solder balls 213 without increasing the plane area of the semiconductor device 1.

Furthermore, it is desirable that, as shown in FIG. 2, the second solder ball 222 together with the first solder balls 213 should be arranged in the same quadrant Q demarcated by the two axes X, Y which pass through the center of the plane of the package substrate 2, and which are orthogonal to each other.

The present embodiment makes only one combination set of the third land 220, the branch interconnection 221 and the second solder ball 222 for the connection check. However, no specific restriction is imposed on the number of combination sets. Combination sets for the connection check may be made corresponding to all the first solder balls 213. Otherwise, combination sets for the connection check may be made corresponding to specific first solder balls. In sum, the number of combination sets does not matter as long as the semiconductor device 1 includes at least one combination set for the connection check.

This embodiment adopts the solder balls as the first and second connection terminals. Instead, however, the present invention can preferably adopt connection terminals used for a regular LSI package substrate.

In this embodiment, the semiconductor chip 3 is mounted on the top surface of the package substrate 2. However, a location where the semiconductor chip 3 is mounted is not limited to this. The semiconductor chip 3 may be mounted inside the package substrate 2. Otherwise, the semiconductor chip 3 may be mounted on the undersurface of the package substrate 2.

This embodiment regards the first principal surface of the package substrate 2 as the top surface, and the second principal surface thereof as the undersurface. Instead, however, the reverse configuration may be acceptable.

The foregoing descriptions have been provided for the embodiments of the semiconductor device and the connection checking method for a semiconductor device according to the present invention. The present invention is not limited to the above-described embodiment. The present invention can be variously modified as long as the modification does not depart from the spirit of the present invention. It is apparent that the present invention is not limited to the above embodiments, but may be modified and changed without departing from the scope and spirit of the invention.

What is claimed is:

1. A package-on-package (POP), comprising:
   (a) a semiconductor device, and
   (b) a multi-chip-package located above the semiconductor device,
   wherein the semiconductor device includes:
      (a1) a substrate including:
         a first surface,
         a plurality of electrodes formed on the first surface,
         a second surface opposite to the first surface,
         a plurality of lands formed on the second surface, and
         a plurality of wirings,
      (a2) a semiconductor chip mounted over the first surface of the substrate, and
      (a3) a plurality of first solder balls formed on the lands, respectively,
   wherein the multi-chip-package is electrically connected with the semiconductor device via a plurality of second solder balls,
   wherein the plurality of second solder balls are connected with the plurality of electrodes, respectively,
   wherein the plurality of lands are electrically connected with the plurality of electrodes via the plurality of wirings, respectively,
   wherein the plurality of electrodes include:
      a first electrode, and
      a second electrode,
   wherein the plurality of lands include:
      a first land,
      a second land, and
      a third land,
   wherein the plurality of wirings include:
      a first wiring, and
      a second wiring,
   wherein the first electrode is electrically connected with the first land via the first wiring,
   wherein the second electrode is electrically connected with the second land and the third land via the second wiring,
   wherein the second land is electrically connected with the third land via the second wiring,
   wherein, in the substrate, the semiconductor chip is electrically connected with the first electrode and the first land via the first wiring, and also electrically isolated from the second electrode, the second land and the third land, and
   wherein, in plan view, the semiconductor chip is mounted over the first surface of the substrate such that the semiconductor chip is spaced apart from the first and second electrodes.

2. The package-on-package according to claim 1,
   wherein the substrate includes a pad formed on the first surface, and
   wherein the semiconductor chip is connected with the pad via a bump electrode.

3. The package-on-package according to claim 1,
   wherein the semiconductor chip is sealed with a resin, and
   wherein the first and second electrodes are not sealed with the resin.

4. The package-on-package according to claim 1,
   wherein the second electrode is arranged closer than the first electrode to a peripheral part of the substrate.

5. The package-on-package according to claim 1,
wherein the second and third lands are arranged closer than the first land to a peripheral part of the substrate.
6. The package-on-package according to claim 1,
wherein the second land is arranged between the first land and the third land.
7. The package-on-package according to claim 1,
wherein the multi-chip-package comprises a memory device.
8. A package-on-package (POP), comprising:
(a) a semiconductor device, and
(b) a multi-chip-package located above the semiconductor device,
wherein the semiconductor device includes:
    (a1) a substrate including:
        a first surface,
        a plurality of electrodes formed on the first surface,
        a second surface opposite to the first surface,
        a plurality of lands formed on the second surface, and
        a plurality of wirings,
    (a2) a semiconductor chip mounted over the first surface of the substrate, and
    (a3) a plurality of first solder balls formed on the lands, respectively,
wherein the multi-chip-package is electrically connected with the semiconductor device via a plurality of second solder balls,
wherein the plurality of second solder balls are connected with the plurality of electrodes, respectively,
wherein the plurality of lands are electrically connected with the plurality of electrodes via the plurality of wirings, respectively,
wherein the plurality of electrodes include:
    a first electrode, and
    a second electrode,
wherein the plurality of lands include:
    a first land,
    a second land, and
    a third land,
wherein the plurality of wirings include:
    a first wiring, and
    a second wiring,
wherein the first electrode is electrically connected with the first land via the first wiring,
wherein the second electrode is electrically connected with the second land and the third land via the second wiring,
wherein the second land is electrically connected with the third land via the second wiring,
wherein, in the substrate, the semiconductor chip is electrically connected with the first electrode and the first land via the first wiring, and also electrically isolated from the second electrode, the second land and the third land, and
wherein, the semiconductor chip is mounted over the first surface of the substrate such that the semiconductor chip exposes the first and second electrodes.
9. The package-on-package according to claim 8,
wherein the substrate includes a pad formed on the first surface, and
wherein the semiconductor chip is connected with the pad via a bump electrode.
10. The package-on-package according to claim 8,
wherein the semiconductor chip is sealed with a resin, and
wherein the first and second electrodes are not sealed with the resin.

11. The package-on-package according to claim 8,
wherein the second electrode is arranged closer than the first electrode to a peripheral part of the substrate.
12. The package-on-package according to claim 8,
wherein the second and third lands are arranged closer than the first land to a peripheral part of the substrate.
13. The package-on-package according to claim 8,
wherein the second land is arranged between the first land and the third land.
14. The package-on-package according to claim 8,
wherein the multi-chip-package comprises a memory device.
15. A package-on-package (POP), comprising:
(a) a semiconductor device, and
(c) a multi-chip-package located above the semiconductor device,
wherein the semiconductor device includes:
    (a1) a substrate including:
        a first surface,
        a plurality of electrodes formed on the first surface,
        a second surface opposite to the first surface,
        a plurality of lands formed on the second surface, and
        a plurality of wirings,
    (a2) a semiconductor chip mounted over the first surface of the substrate, and
    (a3) a plurality of first solder balls formed on the lands, respectively,
wherein the multi-chip-package is electrically connected with the semiconductor device via a plurality of second solder balls,
wherein the plurality of second solder balls are connected with the plurality of electrodes, respectively,
wherein the plurality of lands are electrically connected with the plurality of electrodes via the plurality of wirings, respectively,
wherein the plurality of electrodes include:
    a first electrode, and
    a second electrode,
wherein the plurality of lands include:
    a first land,
    a second land, and
    a third land,
wherein the plurality of wirings include:
    a first wiring, and
    a second wiring,
wherein the first electrode is electrically connected with the first land via the first wiring,
wherein the second electrode is electrically connected with the second land and the third land via the second wiring,
wherein the second land is electrically connected with the third land via the second wiring,
wherein, in the substrate, the semiconductor chip is electrically connected with the first electrode and the first land via the first wiring, and also electrically isolated from the second electrode, the second land and the third land, and
wherein, the semiconductor chip is mounted over the first surface of the substrate such that the first and second electrodes are not overlapped with the semiconductor chip.
16. The package-on-package according to claim 15,
wherein the substrate includes a pad formed on the first surface, and
wherein the semiconductor chip is connected with the pad via a bump electrode.

17. The package-on-package according to claim 15, wherein the semiconductor chip is sealed with a resin, and wherein the first and second electrodes are not sealed with the resin.

18. The package-on-package according to claim 15, wherein the second electrode is arranged closer than the first electrode to a peripheral part of the substrate.

19. The package-on-package according to claim 15, wherein the second and third lands are arranged closer than the first land to a peripheral part of the substrate.

20. The package-on-package according to claim 15, wherein the multi-chip-package comprises a memory device.

\* \* \* \* \*